(12) United States Patent
Adetutu et al.

(10) Patent No.: US 7,179,700 B2
(45) Date of Patent: Feb. 20, 2007

(54) SEMICONDUCTOR DEVICE WITH LOW RESISTANCE CONTACTS

(75) Inventors: Olubunmi O. Adetutu, Austin, TX (US); William J. Taylor, Jr., Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 264 days.

(21) Appl. No.: 10/895,553

(22) Filed: Jul. 21, 2004

(65) Prior Publication Data

US 2006/0017110 A1    Jan. 26, 2006

(51) Int. Cl.
   *H01L 21/8238* (2006.01)
(52) U.S. Cl. ................................. 438/199; 438/592
(58) Field of Classification Search ................ 438/197, 438/199, 289, 592; 257/407
   See application file for complete search history.

(56) References Cited

U.S. PATENT DOCUMENTS

| | | | |
|---|---|---|---|
| 5,190,888 A * | 3/1993 | Schwalke et al. ........... | 438/228 |
| 5,268,590 A * | 12/1993 | Pfiester et al. .............. | 257/764 |
| 5,668,024 A * | 9/1997 | Tsai et al. .................... | 438/199 |
| 6,645,798 B2 * | 11/2003 | Hu .............................. | 438/197 |
| 6,967,379 B2 * | 11/2005 | Matsuo ....................... | 257/369 |

OTHER PUBLICATIONS

Pushkar Ranade, et al., "Work Function Engineering of Molybdenum Gate Electrodes by Nitrogen Implantation," Electrochemical and Solid-State Letters, May 30, 2001, vol. 4, No. 11, pp. G85-7, Berkeley, California, U.S.A.
J.C. Hu, et al., "Source/Drain Formation using Cobalt Silicide as Diffusion Source for Deep Sub-micron nMOS," SPIE Conference on Microelectronic Device Technology, Sep. 1998, vol. 3506, pp. 103-111, Santa Clara, California, U.S.A.

* cited by examiner

*Primary Examiner*—Tuan H. Nguyen
(74) *Attorney, Agent, or Firm*—James L. Clingan

(57) ABSTRACT

An N channel transistor and a P channel transistor have their source/drains contacts with different suicides to provide for low resistance contacts. The silicides are chosen to provide good matching of the work functions. The P-type source/drain contacts of the P channel transistors have a silicide that is close to the P work function of 5.2 electron volts, and the N-type source/drain contacts of the N channel transistors have a silicide that is close to the N work function of 4.1 electron volts. This provides for a lower resistance at the interface between these source/drain contact regions and the corresponding silicide. These suicides with differing work functions are achieved with implants as needed. For example, for N-type source/drain contacts and a base metal of cobalt, titanium, or nickel, the implanted material is platinum and/or iridium. For the P-type, the implanted material is erbium, yttrium, dysprosium, gadolinium, hafnium, or holmium.

27 Claims, 11 Drawing Sheets

FIG. 4 -PRIOR ART-

SEMICONDUCTOR DEVICE WITH LOW RESISTANCE CONTACTS

FIELD OF THE INVENTION

The present invention relates to semiconductor devices, and more particularly to contacts to source/drain regions of semiconductor devices.

RELATED ART

As transistor gate lengths shrink with each new generation, the intrinsic resistances (the channel resistance) decreases, but the extrinsic, or parasitic resistances (the extension, source/drain, and contact region), change very little, and in some cases increase. These parasitic resistances comprise an ever-growing portion of the total transistor resistance and are becoming a significant limiter to transistor performance. Of these, the resistance between the heavily doped silicon source/drain region and the silicide is a dominant factor that comprises 30% or more of the total parasitic resistances. A major factor in this resistance is the difference in work function between the silicide and the doped silicon of the source/drain regions. The common approach has been to use a single silicide for both NMOS and PMOS transistors with a work function near the middle of the band gap (work function near 4.6 eV). Thus its difference to the low work function NMOS silicon (near 4.1 eV) and the high work function PMOS silicon (near 5.2 eV) is balanced. If one were to select a single silicide with either a high or a low work function, then the resistance to one transistor type would be very low, but the resistance to the other type would be unacceptably very high.

An alternative to this approach is to deposit and/or react two different metals with different work functions: a high work function material for PMOS transistors, and a low work function material for NMOS transistors. While this would allow low resistances on both transistors, the disadvantage of this approach is the added complexity of processing.

Thus, there is a need to have a contact that overcomes or reduces the problems in forming contacts described above.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a device structure includes a P channel transistor and an N channel transistor with silicided source/drains. The silicide material has a work function near the midpoint between P channel transistor source/drain work function (5.2 eV) and N channel source/drain work function (4.1 eV). One implant step changes the silicided N channel transistor source/drains closer to 4.1 eV, and another implant step changes the silicided P channel transistor source/drains closer to 5.2 eV. These implant steps can occur at a variety of locations in a process. For example, this can be after silicide formation and after the unreacted metal has been removed. They can be after silicide but before the unreacted metal has been removed. They can be after metal formation but before the silicide reaction. They can even be before the metal deposition that is used for the silicide reaction. This is better understood with reference to the FIGS. and the following description.

Figure 1:
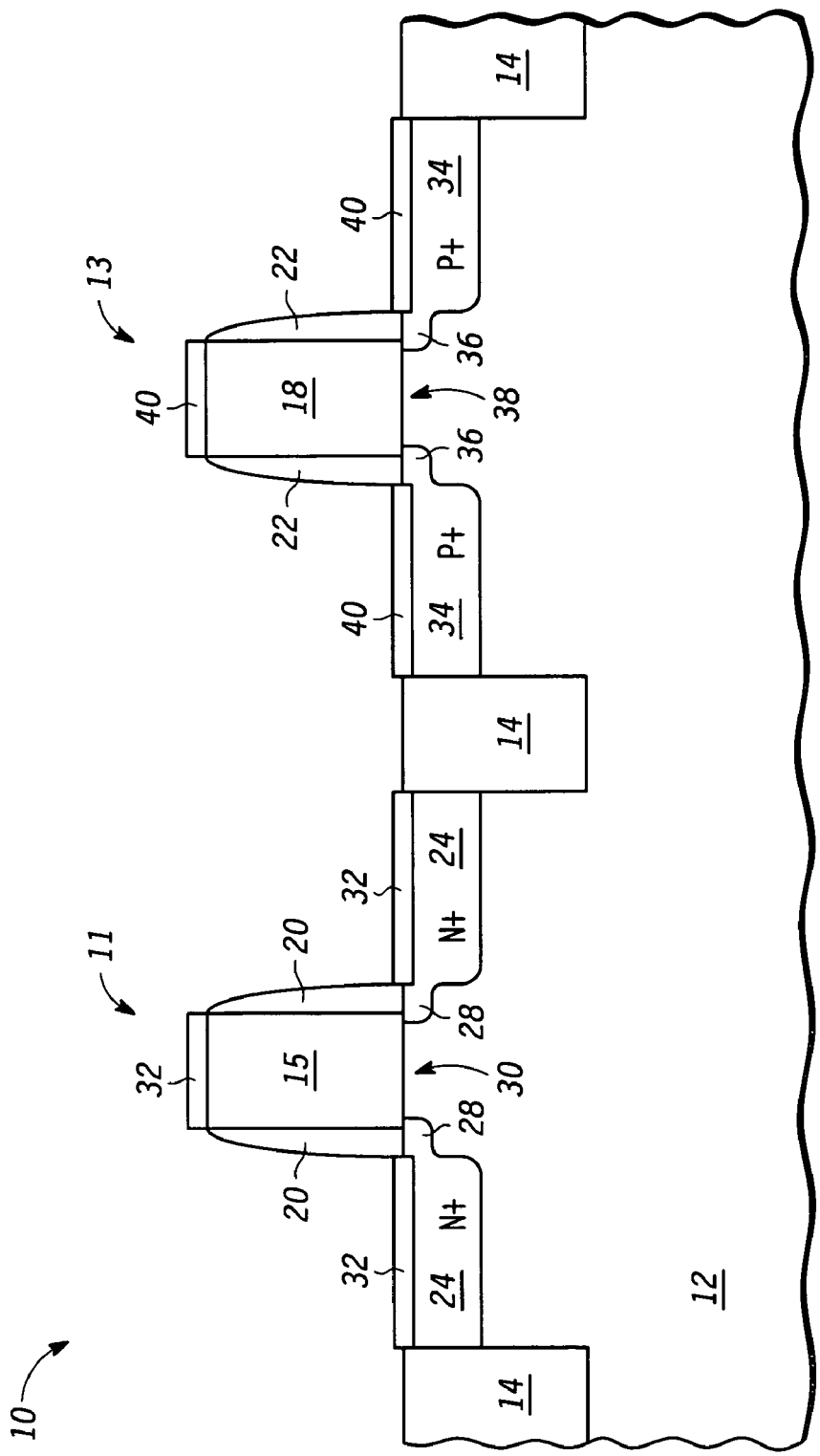
FIG. 1 is a cross section of a semiconductor device at a stage in processing according to the prior art.

FIG. 1 illustrates a semiconductor device 10 comprising a semiconductor substrate 12, an isolation region 14 formed in substrate 12, a gate electrode 15 over substrate 12 and insulated therefrom by a gate dielectric (not shown), a sidewall spacer 20 around gate electrode 15, N-type extension regions 28, N-type source/drain regions 24, a channel region 30 under gate 15 and between source/drain extensions 28, silicided regions 32 over and in contact with source/drain regions 24 and gate electrode 15 over substrate 12 and insulated therefrom by a gate dielectric (not shown), a gate electrode 18, a sidewall spacer 22 around gate electrode 18, P-type extension regions 36, P-type source/drain regions 34, a channel region 38 between P-type extensions 36, and silicided regions 40 over and on source/drain regions 34 and gate electrode 18.

Substrate 12 is shown as a bulk silicon substrate but substrate 12 could also be a semiconductor layer in a semiconductor-on-insulator (SOI) type substrate. Gate electrodes 15 and 18 as shown are polysilicon but could be another material such as a metal. Gate electrode 15, channel 30, N type extensions 28, and source/drain regions 24 form an N channel transistor 11. Gate electrode 18, P type extensions 36, channel 38, and source/drain regions 34 form a P channel transistor 13. P channel transistor 13 and N channel transistor 11 are isolated from each other by isolation regions 14. In this example, silicide regions 40 and 32 have been fully formed and the metal that was deposited over areas where there was no silicon, which resulted in no silicide formation in those areas, has been removed. In this example, the metal that is used to form the silicide is cobalt so that after siliciding, silicided regions 32 and 44 are cobalt disilicide. Other materials or combinations of materials, such as nickel and titanium, may also be used as the metal to react with silicon to form the silicide.

Figure 2:
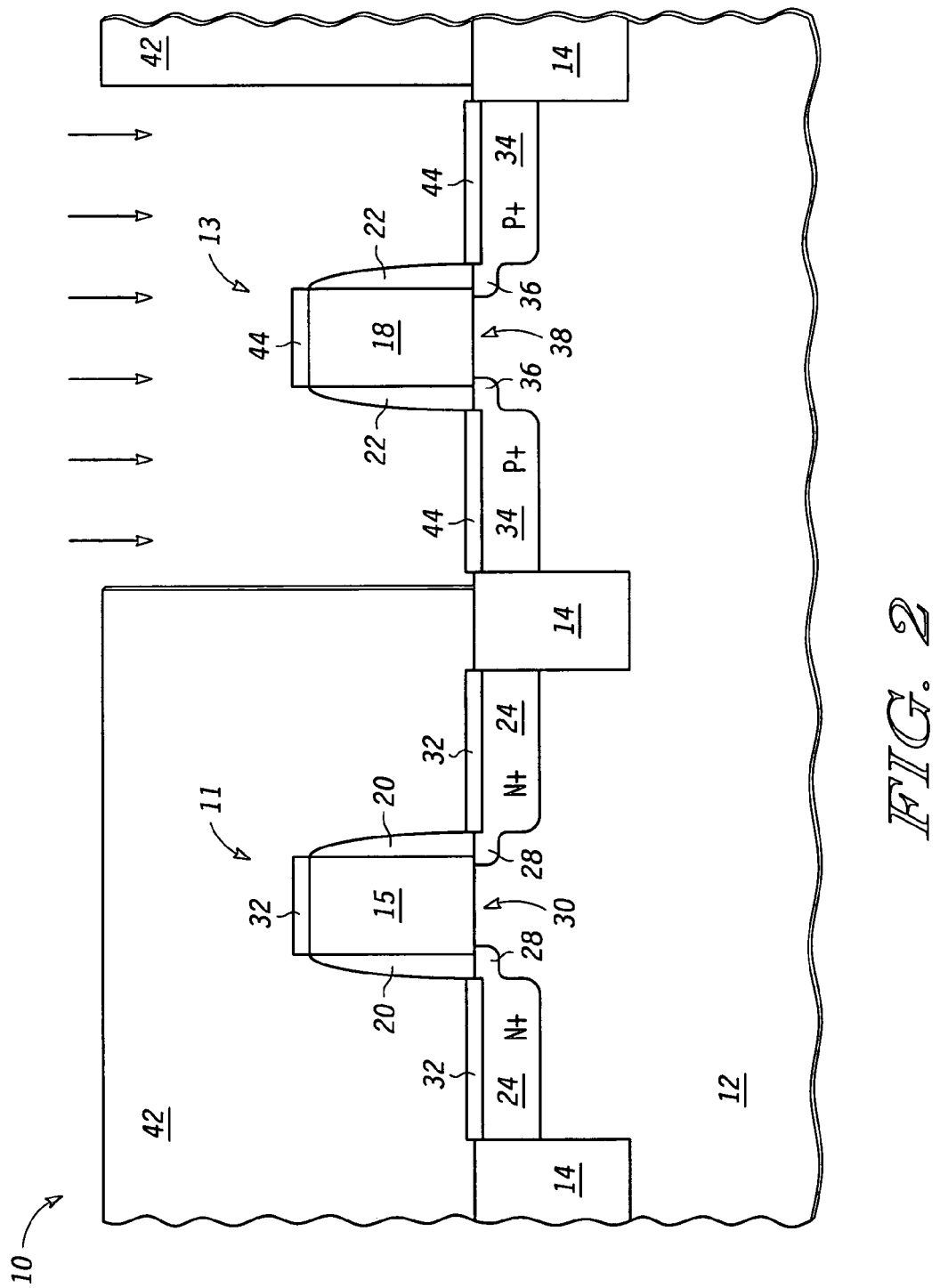
FIG. 2 is a cross section of the semiconductor device of FIG. 1 at a subsequent stage in processing according to a first embodiment of the invention.

Shown in FIG. 2 is semiconductor 10 after a mask 42 has been formed over N channel transistor 11 and silicide regions 44 have been implanted with platinum and/or iridium. This has the effect of moving the work function of the cobalt disilicide toward the P region work function of 5.2 eV. The dose is preferably between one times ten to the fourteenth (1e14) and 1e16 atoms per centimeter squared. Other doses may be effective as well. The higher dose will cause more change in work function but increases time for performing the implant and may adversely affect leakage. Other materials may also be effective for this purpose.

Figure 3:
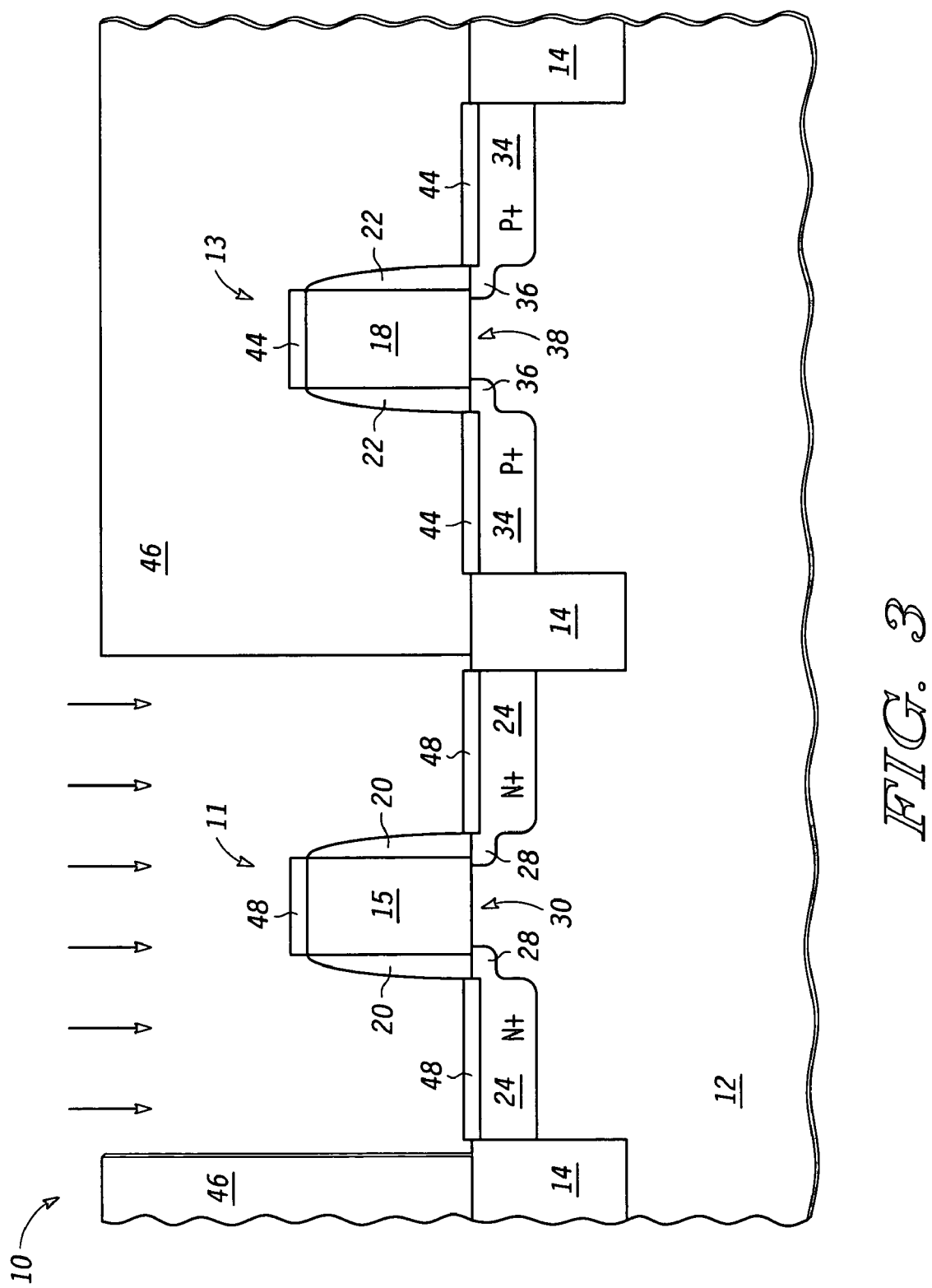
FIG. 3 is a cross section of the semiconductor device of FIG. 2 at a subsequent stage in processing according to the first embodiment of the invention.

Shown in FIG. 3 is semiconductor device 10 after removing mask 42, forming mask 46 over P channel transistor 13, and implanting into silicide regions 48. The implanting in this case is with one or more of erbium, yttrium, dysprosium, gadolinium, hafnium, and holmium to move the work function of silicide region 48 closer to the work function (4.2 eV) of N-type source/drain regions 24. Similar to the implant for the silicide on the P regions, the dose is preferably in the range of 1e14 to 1e16 atoms per centimeter squared with 1e15 being effective to achieve the purpose.

Figure 4:
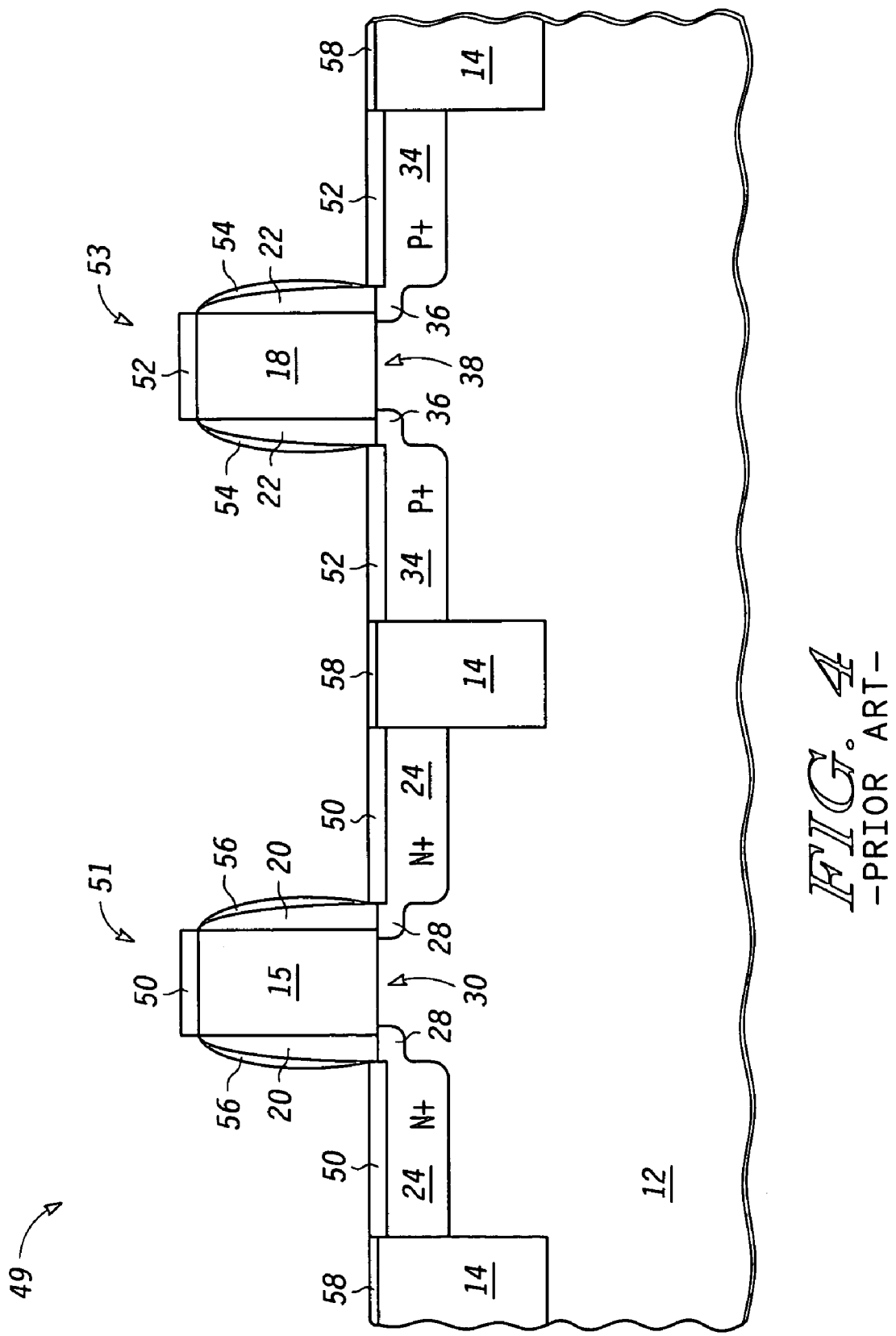
FIG. 4 is a cross section of a semiconductor device similar to that of FIG. 1 in a stage in processing according to the prior art.

Shown in FIG. 4 is a semiconductor device 49 comprising an N channel transistor 51 and a P channel transistor 53 formed in substrate 12 and isolated by isolation regions 14 in which the elements that are in common with semiconductor device 10 of FIGS. 1–3 share the same number. N channel transistor 51 comprises N-type source/drain regions 24, extensions 28, sidewall spacer 20, channel 30, and gate electrode 15. Similarly for P channel transistor 53, the elements in common with P channel transistor 13 are P-type source/drain regions 34, extensions 36, gate electrode 18, channel 38, and sidewall spacer 22. In this case the metal that is used in silicide formation has not yet been removed so that there are remaining metal portions where there is no silicon. Thus, a metal portion 54 remains on sidewall spacer 22, a metal portion 56 remains on sidewall spacer 20, and a metal portion 58 remains over isolation regions 14, and the silicide has not been subjected to the treatment associated with the removal of the metal. Sometimes a portion of the metal over the silicon is not reacted which results in that portion of the metal that is not reacted is over the silicide. In this example, all of the metal over silicon is assumed to have been reacted so that no metal remains on the silicide. Thus as shown in FIG. 4, transistor 51 has silicide regions 50 over and on source/drain regions 24 and gate electrode 15. Similarly, transistor 53 has silicide regions 52 over and on source/drain regions 34 and gate electrode 18.

Figure 5:
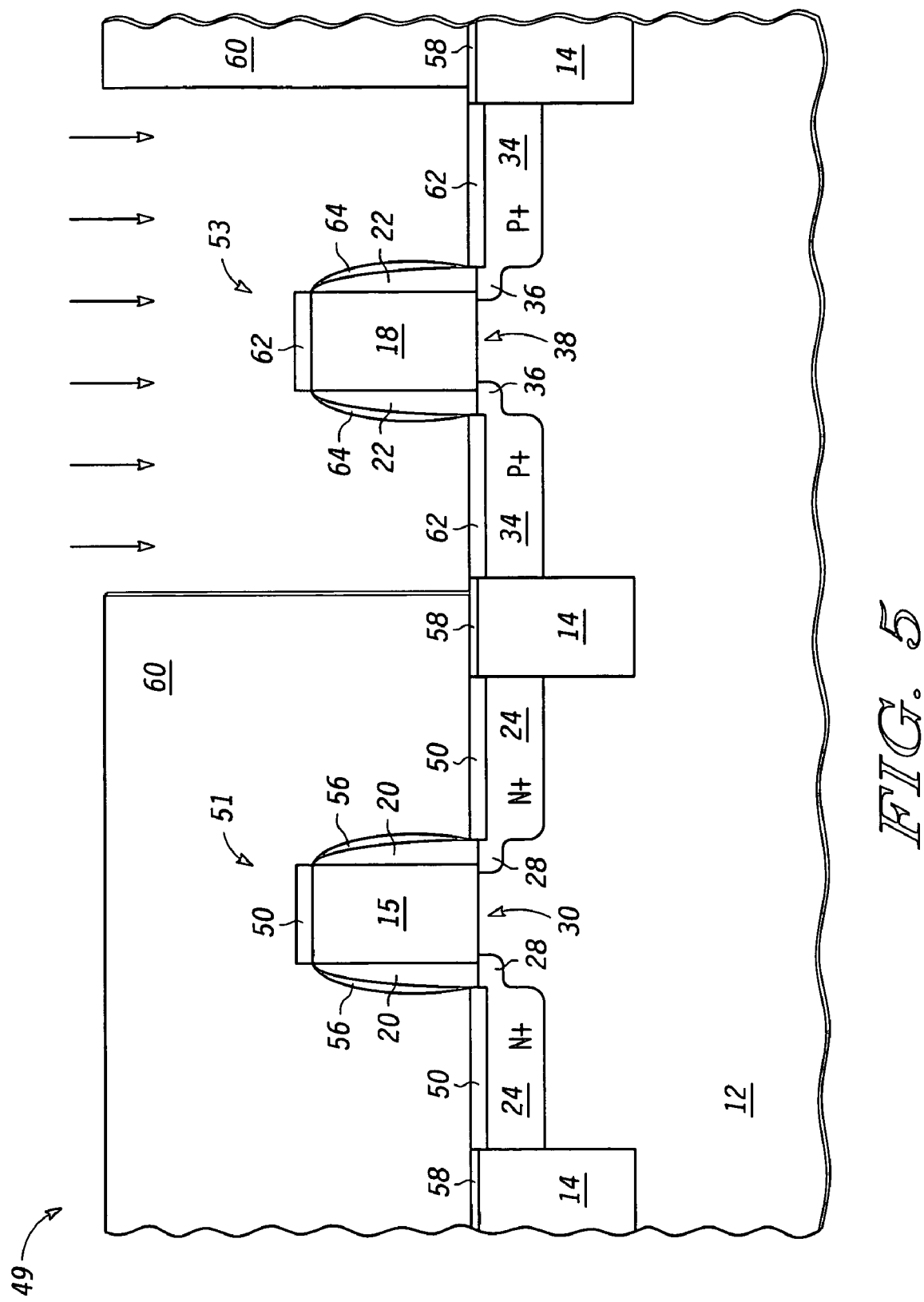
FIG. 5 is a cross section of the semiconductor device of FIG. 4 at a subsequent stage in processing according to a second embodiment of the invention.

Shown in FIG. 5 is semiconductor device 49 after formation of mask 60 over transistor 51 and an implant that is performed the same as that described for the implant shown in FIG. 2 with the same result of moving the work function of silicide 62 closer to that of P regions, specifically P-type source/drain regions 34. This has the beneficial effect of reducing the resistance at the interface between silicide regions 62 and source/drain regions 34. Semiconductor 49 differs from semiconductor device 10 in that metal 56, 58, and 64 has not yet been removed at the time of the implant.

Figure 6:
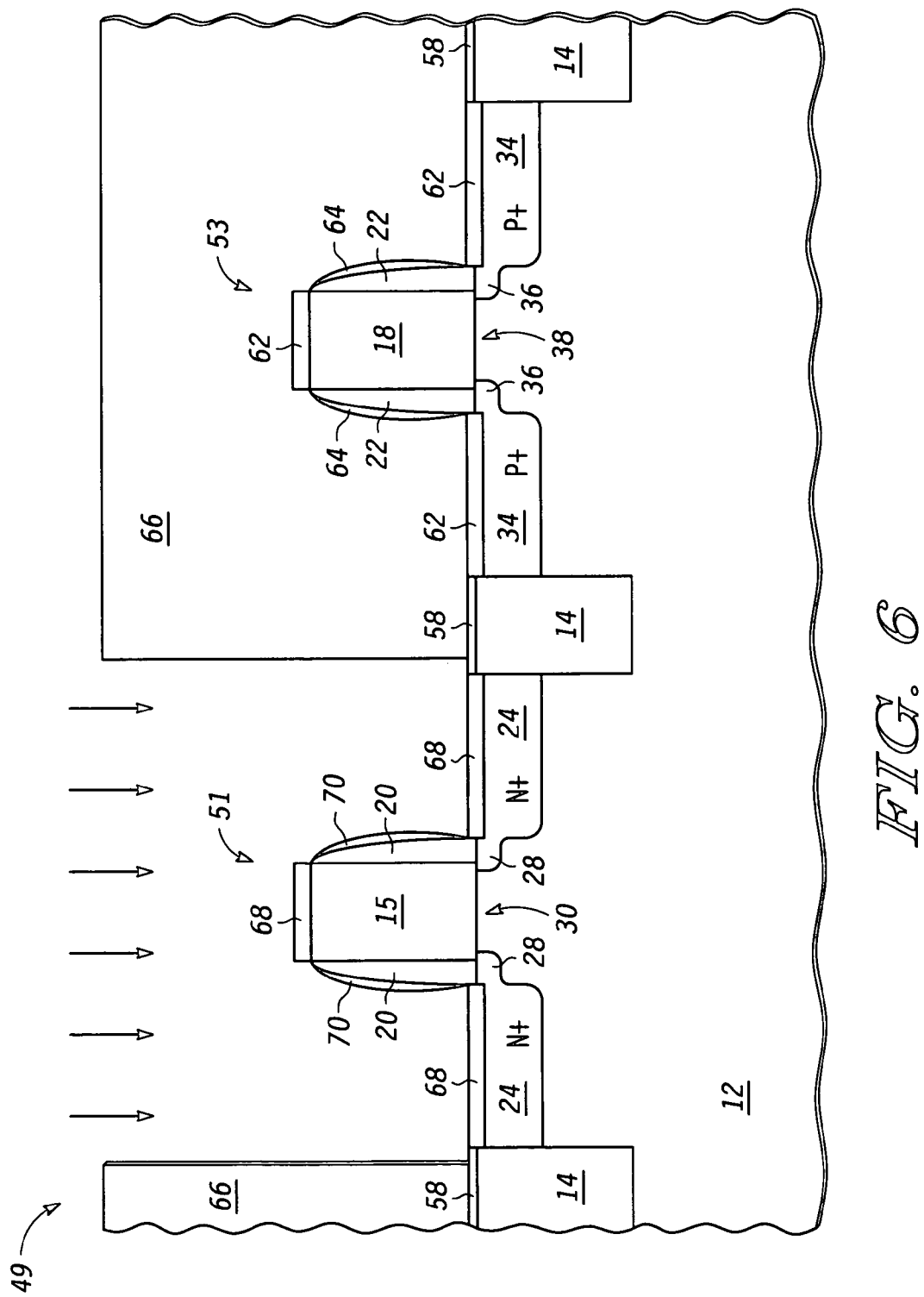
FIG. 6 is a cross section of the semiconductor device of FIG. 5 at a subsequent stage in processing according to the second embodiment of the invention.

Shown in FIG. 6 is semiconductor 49 after removal of mask 60, formation of mask 66 over P channel transistor 53, and an implant that is performed in the same manner as that described for the implant of FIG. 3. This implant similarly has the effect of moving the work function of silicide regions closer to the work function of source/drain regions 24 and thus forming a lower resistance contact.

Figure 7:
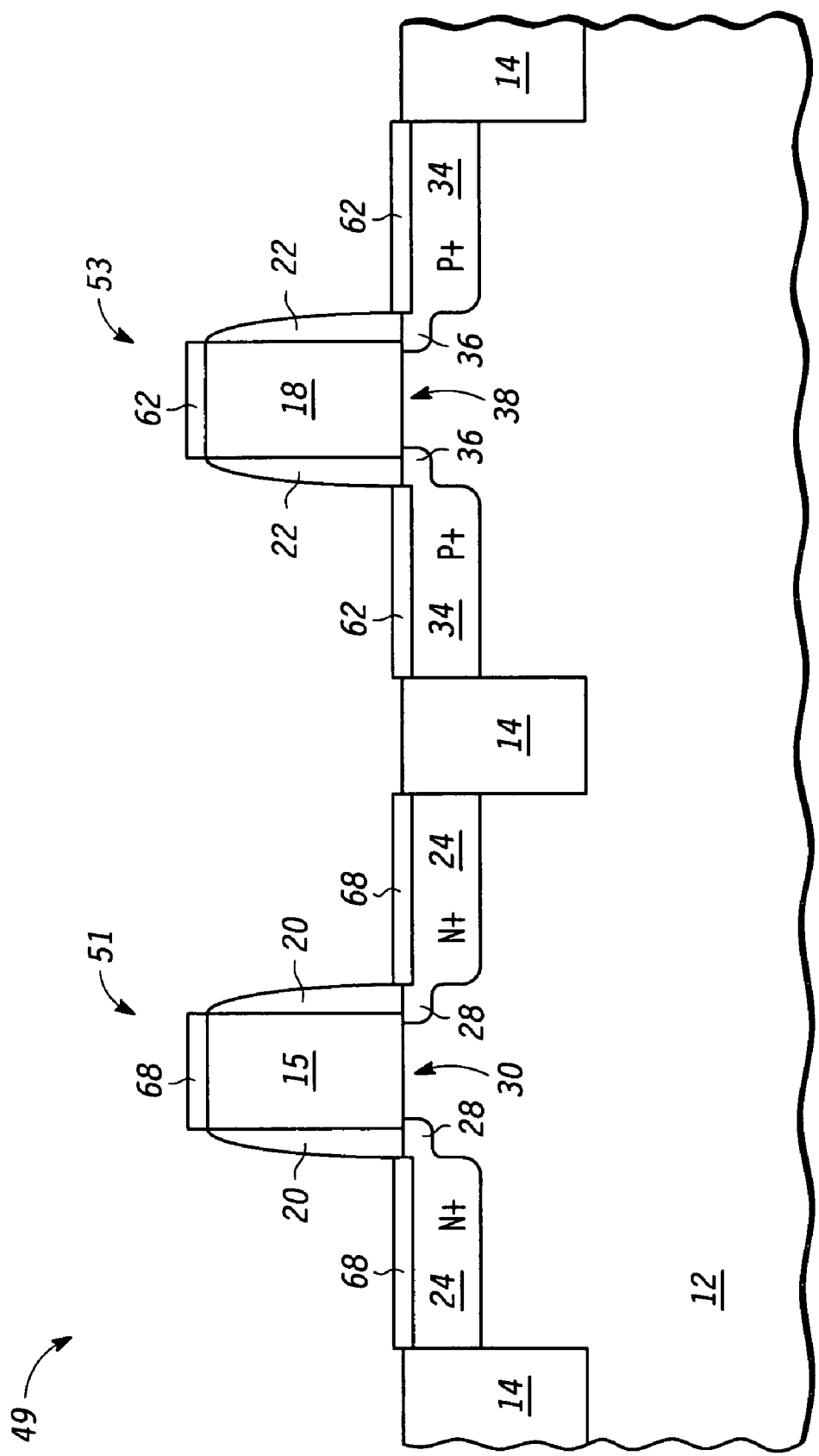
FIG. 7 is a cross section of the semiconductor device of FIG. 5 at a subsequent stage in processing according to the second embodiment of the invention.

Shown in FIG. 7 is semiconductor device 49 after removal of metal portions 58, 64, and 70.

Figure 8:
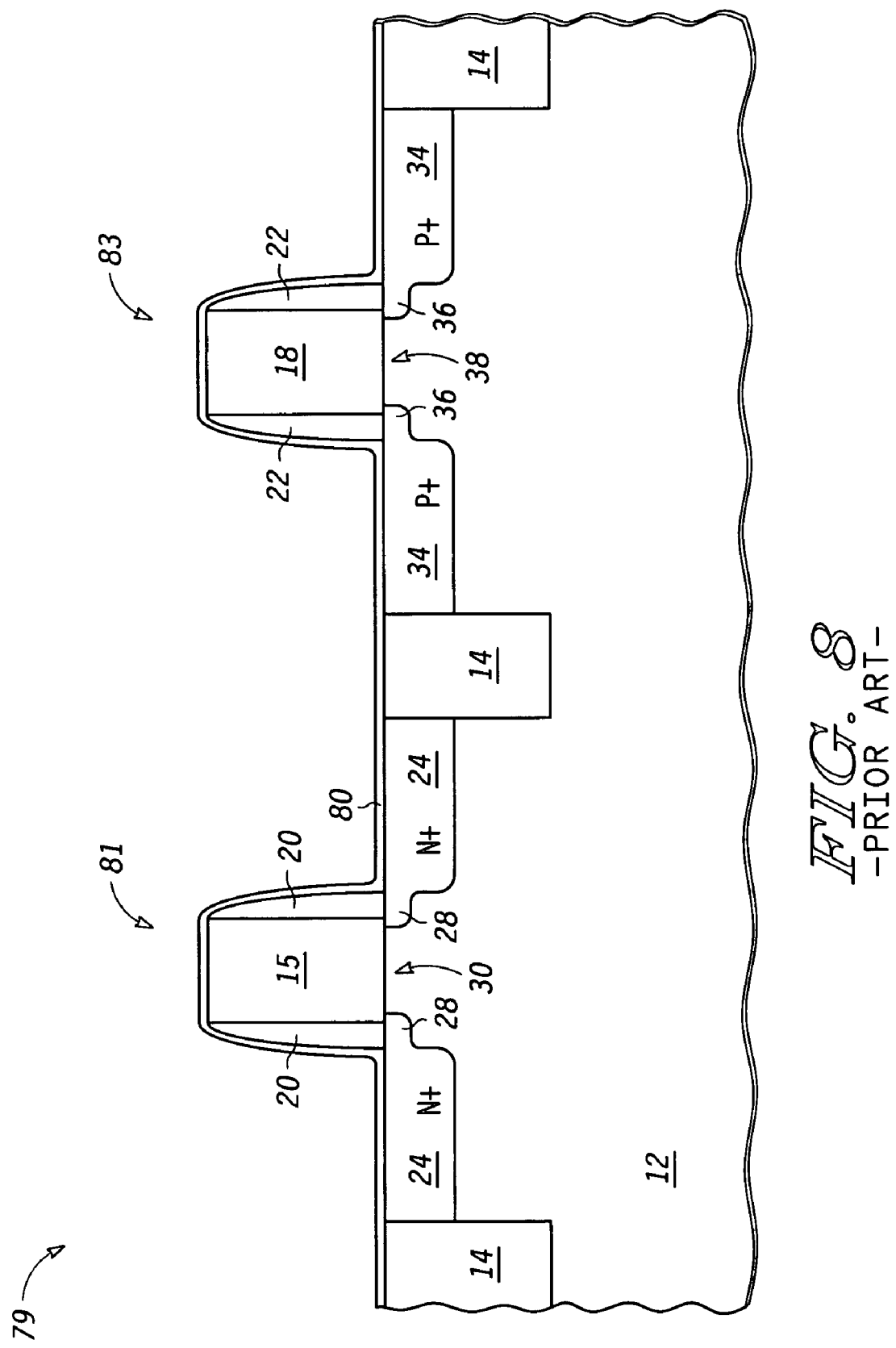
FIG. 8 is a cross section of a semiconductor device similar to that of FIGS. 1 and 4 in a stage in processing according to the prior art.

Shown in FIG. 8 is a semiconductor device 79 comprising an N channel transistor 81 and a P channel transistor 83 formed in substrate 12 and isolated by isolation regions 14 in which the elements that are in common with semiconductor 10 of FIGS. 1–3 share the same number. N channel transistor 81 comprises N-type source/drain regions 24, extensions 28, sidewall spacer 20, channel 30, and gate electrode 15. Similarly for P channel transistor 83, the elements in common with P channel transistor 13 are P-type source/drain regions 34, extensions 36, gate electrode 18, channel 38, and sidewall spacer 22. In this case the metal that is used in silicide formation has not yet been reacted with silicon so that there is a metal layer 80 over transistor 81, isolation regions 14, and transistor 83. Thus, at this stage, there has not yet been any silicide formed for the contacts to the source/drain regions. The metal of metal layer 80 is preferably cobalt or a metal stack containing cobalt but could be other suitable materials.

Figure 9:
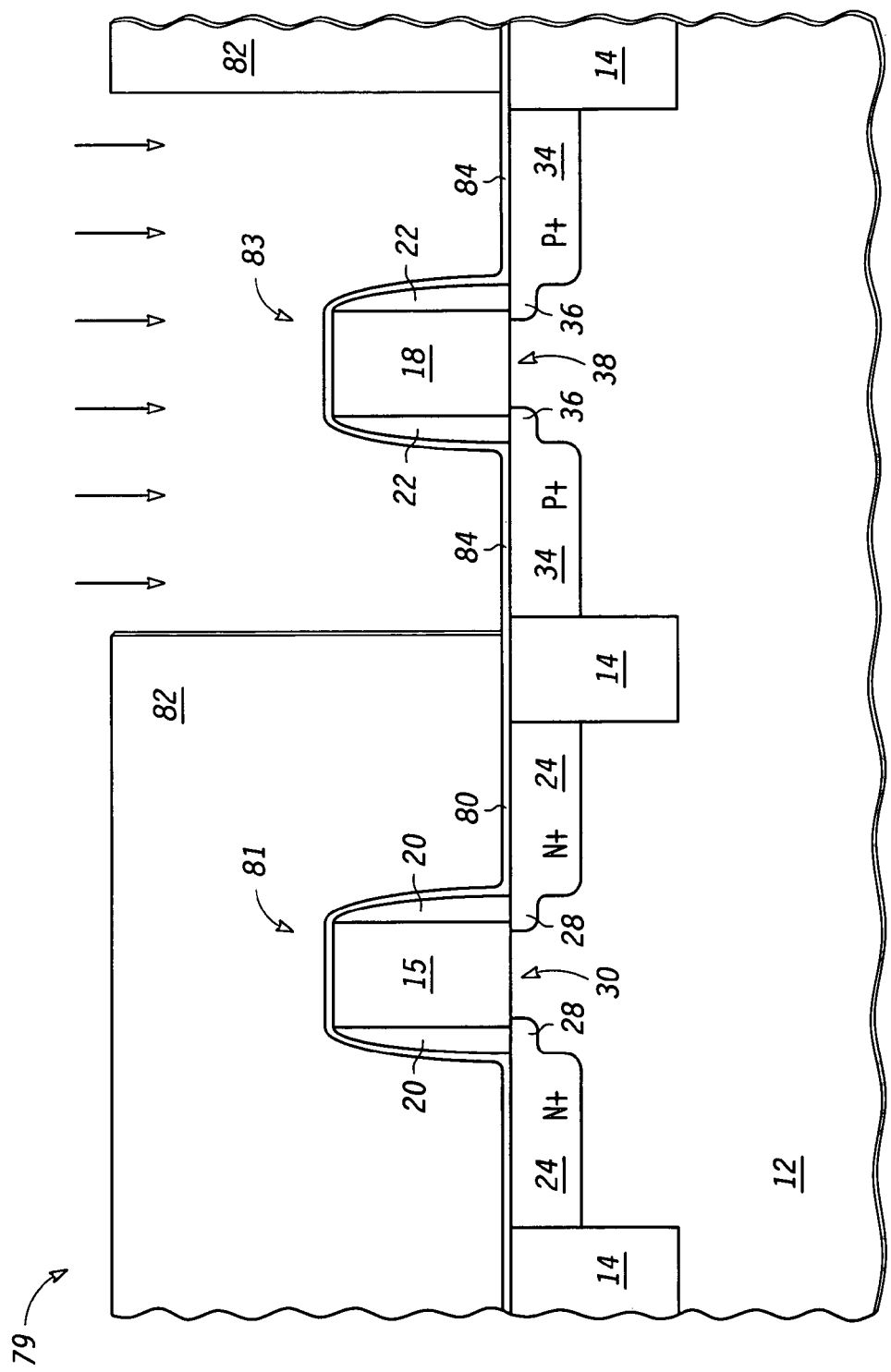
FIG. 9 is a cross section of the semiconductor device of FIG. 8 at a subsequent stage in processing according to a second embodiment of the invention.

Shown in FIG. 9 is semiconductor device 79 after formation of mask 82 over transistor 81 and the implanting of metal layer 80 to form a doped metal layer 84 over transistor 83. A small amount of the implanted species may penetrate beyond metal layer 80 without adversely affecting the contact. This implant is with the same choice of materials and dosages as used for the implants described for FIGS. 2 and 5. Thus metal layer 84 is preferably cobalt doped with platinum and/or iridium.

Figure 10:
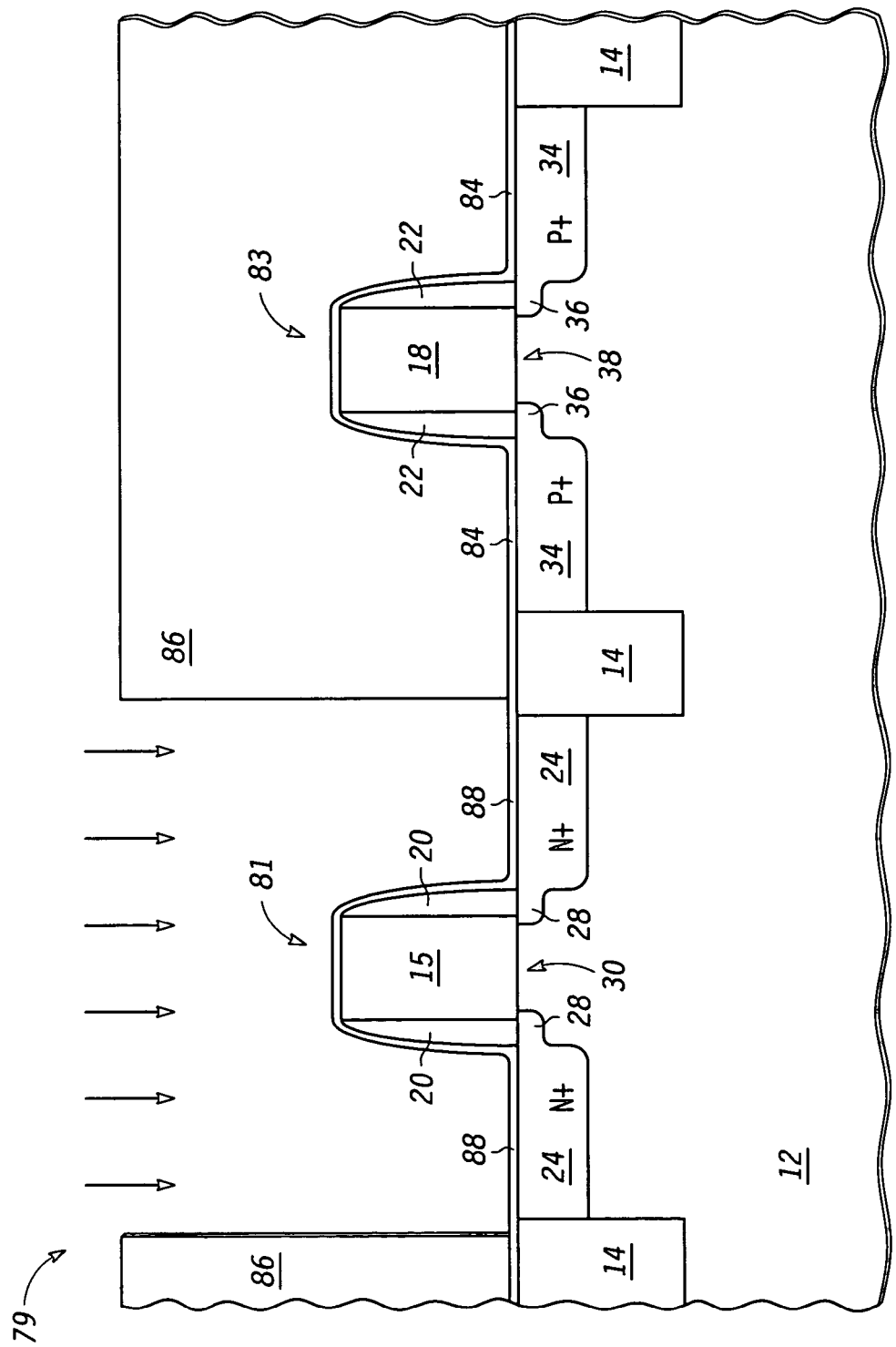
FIG. 10 is a cross section of the semiconductor device of FIG. 9 at a subsequent stage in processing according to the second embodiment of the invention.

Shown in FIG. 10 is semiconductor device 79 after removal of mask 82, formation of mask 86 over transistor 83, and implanting into metal layer 80 over transistor 81 to form a doped metal layer 88. A small amount of the implanted species may penetrate beyond metal layer 80 without adversely affecting the contact. This implant is performed as that described for FIGS. 3 and 6.

Figure 11:
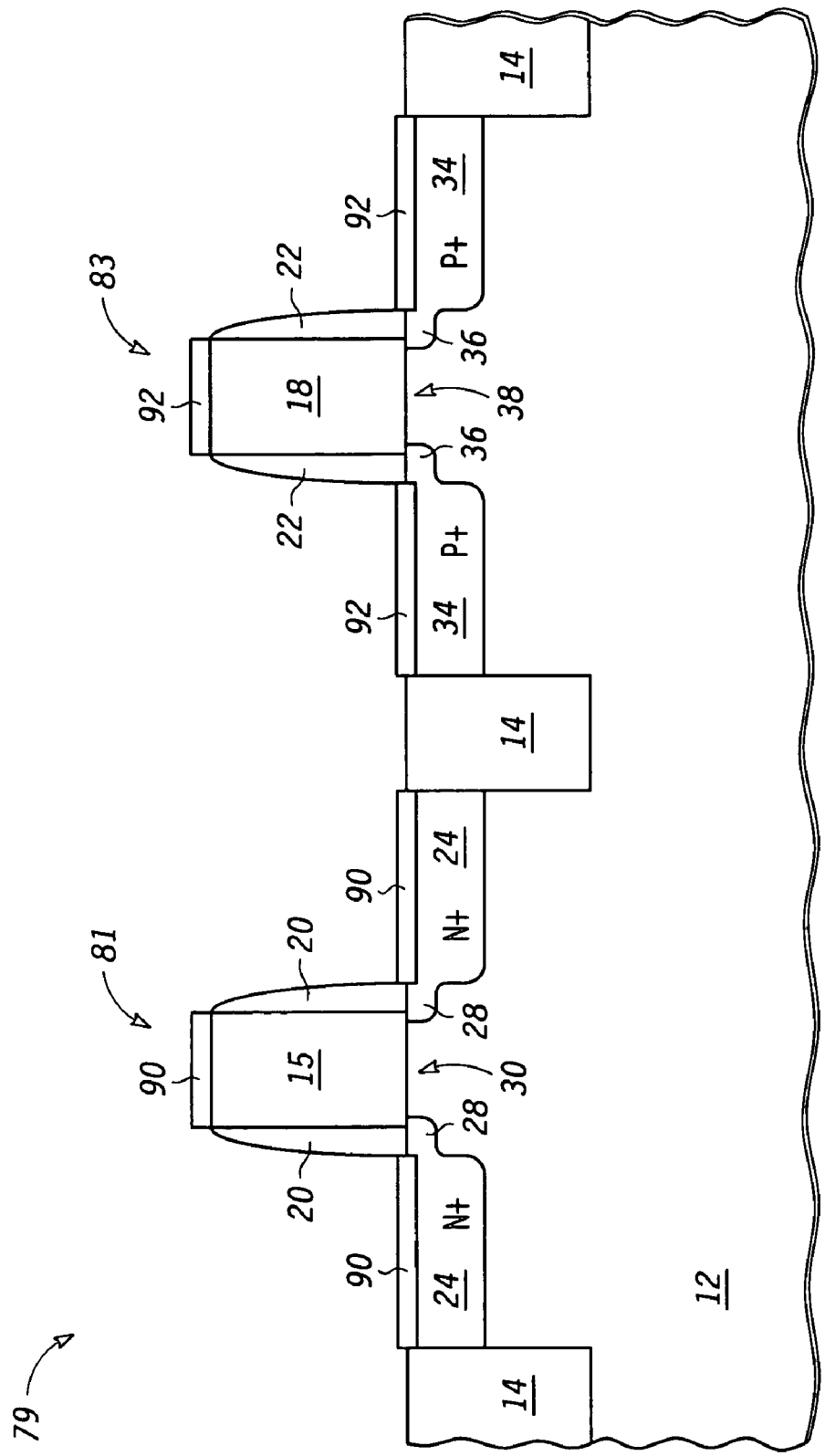
FIG. 11 is a cross section of the semiconductor device of FIG. 10 at a subsequent stage in processing according to the second embodiment of the invention.

Shown in FIG. 11 is semiconductor device after a heating step to form silicide where there is underlying silicon and removing the unreacted metal. Silicide regions 90 are formed over and on source/drain regions 24 and gate electrode 15. Similarly silicide regions 92 are formed on and over source/drain regions 34 and gate electrode 18. Since doped metal portion 88 that was used to form silicide 90 comprised cobalt and a material selected from one or more of erbium, yttrium, dysprosium, gadolinium, and holmium, the resulting silicide regions 90 also had these materials. Thus, silicide 90 had its work function moved closer to that of N-type source/drain regions 24 as a result of the implant described for FIG. 10. Similarly silicide 92 had its work function moved closer to that of P-type source/drain regions 34 as a result of the implant described for FIG. 9.

Thus, the resistance due to work function differential between the silicide and the source/drain region is improved for both the N channel P channel transistors. The sequence of which transistor type is implanted first is not particularly relevant. As an alternative to forming a mid-gap silicide, it may be advantageous to use a metal that results in the silicide having a work function that is not mid-gap but is nearer either the N region or P region work function and then only implanting the transistor type that is further from the work function of the silicide. This would save one patterning and one implanting step. A disadvantage is that it may require a higher dose of the implant and thus potentially make the disadvantages of a high dose too severe. Such starting metals that may be used for this purpose include platinum, iridium, and erbium.

In these embodiments of the invention, a metal is deposited and silicided to aid in reducing resistance in source/drain contacts. In the first two embodiments, implanting was performed after silicide formation. The third embodiment implanted into the metal before siliciding. Another alternative is to implant into the surface region of the source/drain regions prior to metal deposition. For example, the implant of platinum and/or iridium described for the implant of FIG. 9 would be into the surface of source/drain regions 34 prior to depositing metal layer 80. Similarly, the implant described for FIG. 10 would be into the surface of source/drain regions 24 prior to the formation of metal layer 80. As even yet another alternative, one implant could be before metal deposition and one after metal deposition.

In the foregoing specification, the invention has been described with reference to specific embodiments. However, one of ordinary skill in the art appreciates that various modifications and changes can be made without departing from the scope of the present invention as set forth in the claims below. For example, the substrate was described as being silicon but another material could be used, such silicon germanium. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   providing a substrate having a semiconductor region;
   forming a first gate, first source/drain contact regions adjacent to the first gate that are in the semiconductor region and of a first conductivity type, a second gate, and second source/drain contact regions adjacent to the second gate that are in the semiconductor region and of a second conductivity type, wherein the second source/drain contact regions are characterized by having a first work function;
   forming a conductive layer over the first gate, the second gate, the first source/drain contact regions, and the second source/drain contact regions,
   forming a first mask that covers the first source/drain contact regions and is open over the second source drain contact regions;
   after forming the conductive layer over the first gate, performing an implant of a first material directed toward the substrate while the mask covers the first source/drain contact regions and is open over the second source drain contact region so that the implant is into a portion of the conductive layer that is over the second source/drain contact regions for causing a work function change toward the first work function, wherein the material is a not a semiconductor dopant; and
   removing the mask.

2. The method of claim 1, further comprising:
   performing a reaction of a portion of the conductive layer with the underlying semiconductor region.

3. The method of claim 2, wherein the performing the reaction is prior to the implanting.

4. The method of claim 2, wherein the performing the reaction is after the implanting.

5. The method of claim 2 further comprising an isolation region in the semiconductor region.

6. The method of claim 5, wherein the reaction does not occur over the isolation region so that the conductive layer has reacted regions and unreacted regions.

7. The method of claim 6, further comprising removing the unreacted regions after performing the reaction.

8. The method of claim 7, wherein the implanting is after the removing the unreacted regions.

9. The method of claim 7, wherein the implanting is prior to the removing the unreacted regions.

10. The method of claim 1 wherein the conductive layer comprises a first metal type and the first material comprises a second metal type different from the first metal type.

11. The method of claim 10, wherein the first material is selected from the group consisting of erbium, yttrium, dysprosium, gadolinium, hafnium, and holmium.

12. The method of claim 10 wherein the first material is selected from the group consisting of platinum and iridium.

13. The method of claim 1, further comprising:
   forming a second mask that covers the second source/drain contact regions is open over the first source/drain contact regions; and
   implanting a second material into the first conductive layer over the first source/drain contacts with the second source/drain contact regions masked from the implanting to alter the work function of the first conductive layer over the first source/drain contact regions;
   wherein the first material comprises a first metal and the second material comprises a second metal different from the first metal.

14. The method of claim 13, wherein the first conductivity type is N-type, the second conductivity type is P-type, the first material is selected from the group consisting of iridium and platinum and the second material is selected from the group consisting of erbium, yttrium, dysprosium, gadolinium, hafnium, and holmium.

15. The method of claim 13, wherein the first conductivity type is N-type, the second conductivity type is P-type, the first material is platinum, and the second material is gadolinium.

16. The method of claim 13, further comprising performing a reaction of a portion of the conductive layer prior to implanting the second material.

17. The method of claim 13, further comprising performing a reaction of a portion of the conductive layer after implanting the second material.

18. The method of claim 13, further comprising;
   performing a reaction of a first portion of the conductive layer and leaving a second portion of the conductive layer unreacted, wherein the performing the reaction is prior to the implanting the second material.

19. The method of claim 18, wherein the removing the second portion is prior to the implanting the second material.

20. The method of claim 13, further comprising:
performing a reaction of a first portion of the conductive layer and leaving a second portion of the conductive layer unreacted; and
removing the second portion after the implanting the second material.

21. The method of claim 20, wherein the performing the reaction is after implanting the second material.

22. The method of claim 20, wherein the implanting the first material is after the step of performing the reaction.

23. The method of claim 1, wherein the first material comprises a metal.

24. A method, comprising:
providing a substrate having a semiconductor region;
forming a first gate, first source/drain contact regions adjacent to the first gate that are in the semiconductor region and are N-type, a second gate, and second source/drain contact regions adjacent to the second gate that are in the semiconductor region and are P-type;
forming a conductive layer comprising a first material selected from a group consisting of cobalt, titanium, and nickel over the first gate, the second gate, the first source/drain contact regions, and the second source/drain contact regions;
forming a first mask that covers the first source/drain contact regions and is open over the second source drain regions;
performing an implant of a second material selected from the group consisting of iridium and platinum directed toward the substrate while the first mask covers the first source/drain contact regions and is open over the second source drain;
removing the first mask;
forming a second mask that covers the second source/drain contact regions and is open over the first source drain regions;
performing an implant of a third material selected from the group consisting of erbium, yttrium, dysprosium, gadolinium, hafnium, and holmium directed toward the substrate while the second mask covers the second source/drain contact regions and is open over the first source/drain contacts; and
removing the second mask.

25. The method of claim 24, wherein the implant of the second and third materials is into the metal layer.

26. The method of claim 24, wherein the implanting the second material is prior to forming the metal layer.

27. The method of claim 24, wherein the implanting the second material is after the implanting the third material.

* * * * *